United States Patent
Chua et al.

(10) Patent No.: US 9,444,224 B2
(45) Date of Patent: Sep. 13, 2016

(54) NITRIDE LASER DIODE WITH ENGINEERED NON-UNIFORM ALLOY COMPOSITION IN THE N-CLADDING LAYER

(71) Applicant: PALO ALTO RESEARCH CENTER INCORPORATED, Palo Alto, CA (US)

(72) Inventors: Christopher L. Chua, San Jose, CA (US); Thomas Wunderer, Palo Alto, CA (US); Zhihong Yang, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 14/563,847

(22) Filed: Dec. 8, 2014

(65) Prior Publication Data
US 2016/0164260 A1    Jun. 9, 2016

(51) Int. Cl.
| | |
|---|---|
| H01S 5/30 | (2006.01) |
| H01S 5/32 | (2006.01) |
| H01S 5/323 | (2006.01) |
| H01S 5/343 | (2006.01) |
| H01S 5/20 | (2006.01) |

(52) U.S. Cl.
CPC ............... *H01S 5/30* (2013.01); *H01S 5/3211* (2013.01); *H01S 5/3213* (2013.01); *H01S 5/32341* (2013.01); *H01S 5/2031* (2013.01); *H01S 5/309* (2013.01); *H01S 5/3013* (2013.01); *H01S 5/3215* (2013.01); *H01S 5/34333* (2013.01)

(58) Field of Classification Search
CPC ........ H01S 5/30; H01S 5/3013; H01S 5/309; H01S 5/3211; H01S 5/32341; H01S 5/34333
See application file for complete search history.

(56) References Cited

U.S. PATENT DOCUMENTS

| | | | |
|---|---|---|---|
| 6,195,375 B1* | 2/2001 | Hirata | B82Y 20/00 372/45.013 |
| 2005/0077530 A1* | 4/2005 | Chae | H01L 21/28575 257/94 |
| 2008/0299691 A1* | 12/2008 | Bhat | B82Y 20/00 438/31 |
| 2012/0213240 A1* | 8/2012 | Bhat | B82Y 20/00 372/45.011 |

* cited by examiner

*Primary Examiner* — Xinning Niu
(74) *Attorney, Agent, or Firm* — Blakely Sokoloff Taylor & Zafman LLP (57) ABSTRACT

An ultraviolet laser diode having multiple portions in the n-cladding layer is described herein. The laser diode comprises a p-cladding layer, an n-cladding layer, a waveguide, and a light-emitting region. The n-cladding layer includes at least a first portion and a second portion. The first portion maintains material quality of the laser diode, while the second portion pulls the optical mode from the p-cladding layer toward the active region. The first portion may have a higher aluminum composition than the second portion. The waveguide is coupled to the n-cladding layer and the light-emitting region is coupled to the waveguide. The light-emitting region is located between the n-cladding layer and the p-cladding layer. Other embodiments are also described.

25 Claims, 12 Drawing Sheets

NITRIDE LASER DIODE WITH ENGINEERED NON-UNIFORM ALLOY COMPOSITION IN THE N-CLADDING LAYER

STATEMENT REGARDING FEDERALLY SPONSORED RESEARCH AND DEVELOPMENT

This invention was made with Government support under W911NF-10-2-0102 (3713) awarded by Government Army Research Lab. The Government has certain rights in this invention.

FIELD

Embodiments of the invention relate generally to Nitride semiconductor lasers (i.e., laser diodes) having engineered non-uniform alloy composition in the n-cladding layer.

BACKGROUND

Currently, nitride semiconductor laser heterostructures include a plurality of layers that include aluminum alloys. The design of the alloy compositions requires weighing many device performance trade-offs. For some devices, the trade-offs are so severe that all design choices lead to poor overall device performance.

In selecting the level of aluminum composition in the n-cladding and p-cladding layers of UV laser diodes, a low level of aluminum composition is desired in the n-cladding layer and a high level of aluminum content is desired in the p-cladding layer from a modal profile point of view. Such an aluminum alloy profile pushes the optical mode toward the n-side of the device, where the n-type dopant is less optically absorbing, thus enabling the laser diode to realize the low material loss required to operate.

However, such an aluminum alloy profile would lead to very poor material quality because of the large lattice mismatch between the substrate and the active region. Consequently, the crystal defect density will be so high that the laser operation cannot be achieved despite the low material loss. Also, a high level of aluminum content in the alloy composition of the p-cladding layer would lead to a very high device electrical resistance because the activation energy of p-dopants increases rapidly with increasing aluminum alloy composition. This effect can prevent the device from achieving laser operation due to resistive heating.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. In the drawings.

DETAILED DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

Figure 1:
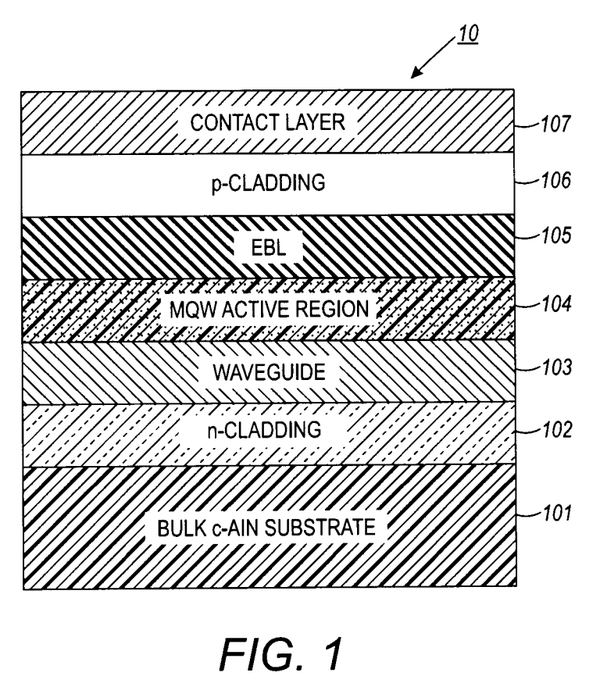
FIG. 1 illustrates a cross-sectional view of an exemplary UV laser diode heterostructure.

In designing an ultraviolet (UV) laser diode, the objectives are to allow for high crystal quality to be achieved at the active region while realizing low device modal loss and high electrical conductivity at the p-side of the diode. FIG. 1 illustrates a cross-sectional view of a laser diode according to one embodiment of the invention. The diode 10 may be formed on a growth substrate 101 such as a bulk aluminum nitride (AlN) substrate or AlN on sapphire template. As shown in FIG. 1, the diode 10 comprises an n-cladding layer 102, a waveguide layer 103, a quantum well region 104, an electron-blocking layer (EBL) 105, a p-cladding layer 106, and a contact layer 107. The diode 10's layers may be fabricated through epitaxial growth on the substrate 101.

It is understood that there may be many quantum wells within the quantum well region 104. The quantum well region 104 is the active region where the electrons and holes recombine and emit light. In order to maximize the recombination occurring in this quantum well region 104, the waveguide layer 103 is located below the quantum well region 104. The waveguide layer 104 is a layer that confines light therein during operation and guides the light along the waveguide layer 103's region towards the end of the diode 10.

In some embodiments, a p-side waveguide is also located above the quantum well region 104. However, in one embodiment, the UV diode 10 only includes one waveguide 103 that is located below the quantum well region 104. In order to enhance the recombination occurring in this quantum well region 104, the EBL 105 may also be located above the quantum well region 104 to block electrons from overshooting the quantum well region 104.

In one embodiment, the diode 10 also includes a front and back reflectors (not shown) located on each end of the diode 10 that will create a resonator that causes the light to bounce back and forth and entering the quantum well region 104.

To guide or confine the light in the waveguide layer 103 region towards the mirror end of the diode 10, the waveguide 103 must be surrounded by a material that has a refractive index lower than that of the waveguide 103, such as the n-cladding layer 102. The n-cladding layer 102 is a cladding layer on the substrate 101's side of the laser diode 10.

In one embodiment, the n-cladding layer 102, the waveguide layer 103, the EBL 105, the p-cladding layer 106 each includes aluminum gallium nitride (AlGaN). It is understood that the refractive index of the AlGaN alloy depends on the amount (e.g., percentage (%)) of aluminum in the AlGaN alloy. Thus, in this embodiment, the amount (e.g., percentage (%)) of aluminum in the AlGaN alloy differs between each of the layers 102, 103, 105, and 106 such that the refractive indexes are different. Specifically, for the waveguide layer 103 to function, the refractive index of the waveguide layer 103 has a higher refractive index than the layers surrounding the waveguide 103. Accordingly, in one embodiment, the n-cladding layer 102 includes an AlGaN alloy having a higher aluminum content (%) such that the refractive index of the n-cladding layer 102 is lower in comparison to the waveguide layer 103.

In accordance with one exemplary laser diode, the aluminum content (%) of each layer in the diode is as follows:

| Layer in the Diode | Aluminum Content in AlGaN |
|---|---|
| p-cladding | 60% AlGaN |
| EBL | 69% AlGaN |
| Waveguide | 57% AlGaN |
| n-cladding | 74% AlGaN |

For a laser diode having a wavelength of 290 nm, the p-cladding material in the p-cladding layer 106 being 60% is sufficiently high for the material to not be inherently absorbing at a wavelength of 290 nm (i.e., the band edge is about 290 nm in wavelength). The composition of the p-cladding material is also sufficiently low such that reasonable voltages can be achieved. However, when combined with a 74% aluminum n-cladding layer 102, the modal profile is unacceptably asymmetric as illustrated in FIG. 2.

Figure 2:
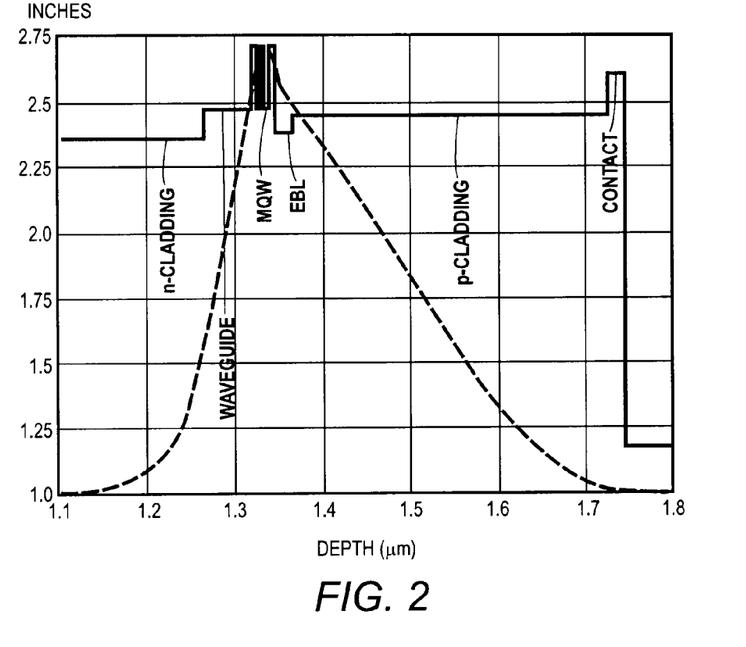
FIG. 2 illustrates a modal profile corresponding to an exemplary laser diode heterostructure.

Referring to FIG. 2, a modal profile corresponding to this exemplary laser diode is illustrated. With respect to the full line illustrated in FIG. 2, the vertical axis of the graph indicates the refractive index of the material and the horizontal axis of the graph indicates the depth of the diode (and corresponding layer at each depth). With respect to the dashed line in FIG. 2, the vertical axis of the graph indicates the intensity of the light and the horizontal axis of the graph indicates the depth of the diode (and the corresponding layer at each depth).

Referring to the full line, the refractive index is lower in the n-cladding layer 102 than in the waveguide 103, which allows for the waveguide 103 to confine the light. This confinement is illustrated in the dashed line in FIG. 2 where the peak of the light's intensity is at the quantum well region 104. As discussed above, it is optimal to maximize the interaction between the light intensity and the region where this interaction is needed to generate light: the quantum well region 104. However, while the peak of the light's intensity is located at the quantum well region 104, the modal profile of the exemplary diode as illustrated in the dashed line of FIG. 2 shows that there is leakage of light into the p-cladding region 106. According to this exemplary diode, although the p-cladding layer 106 has a lower refractive index than the waveguide 103, the modal profile of the exemplary diode is asymmetrical such that the light is not tightly confined around the quantum well region 104. The leakage of the light towards the p-cladding region 106 results in interaction between the light and the p-cladding region 106 as well as the contact layer 107. With regards to the p-cladding region 106, despite the high bandgap of the AlGaN material, the magnesium (Mg) doping at the p-cladding region 106 makes the material highly optically absorbing. With regards to the contact layer 107, the contact layer 107 is a metal that is also highly light absorbing. Thus, the leakage of the light towards the p-cladding region 106 to be absorbed by the p-cladding region 106 and the contact layer 107 results in a high optical loss that causes the exemplary laser diode's performance to suffer because the active region of the diode will not be sufficient to overcome the internal loss. It is understood that the EBL 103 may also affect the leakage of the light towards the p-cladding layer 106 because the EBL 103 in FIG. 2 has a low refractive index (e.g., 69% AlGaN).

In an effort to push the modal profile of the exemplary diode back towards the quantum well region 104, the aluminum content of the alloy AlGaN in the p-cladding layer 106 may be increased. This causes the p-cladding layer 106 to have a lower refractive index and optically, the mode is pushed away from the layer having a lower refractive index. However, the tradeoff for this amelioration in the modal profile of the exemplary diode is that the p-cladding layer 106 with higher aluminum content increases the electrical resistance of the p-cladding layer 106. An increase in electrical resistance thus causes the p-cladding layer 106 to become poorly electrically conductive. Since the performance of a laser diode requires that the p-cladding layer 106 be an electrically conductive layer to the contact layer 107, the performance of this exemplary laser diode that has the increased aluminum content in the p-cladding layer 106 also suffers. Accordingly, the aluminum content of the p-cladding layer 106 is limited by the laser diode's voltage. High aluminum alloy mole fractions lead to rapidly increasing p-cladding layer's 106 resistances. However, in some embodiments, polarization-assisted hole doped p-structures are used that enable reasonable voltages even at Al percentages of up to 60% as in the exemplary laser diode.

In order to pull the modal profile (electric field profile) towards the quantum well region 104, the aluminum content in the n-cladding layer 102 may also be lowered such that the refractive index of the n-cladding layer 102 is increased. However, the tradeoff of this solution is that the lowering of the aluminum content in the n-cladding layer 102 results in poor material quality in the diode. Specifically, the large difference between the aluminum content between the n-cladding layer 102 and the quantum well region 104 creates a large crystal lattice mismatch. Each of the layers in the laser diode has a lattice constant that denotes the separation between the atoms in a crystal. The separation between the atoms is dependent on the content of aluminum in the alloy (e.g., AlGaN) in each of the layers. The higher aluminum content, the smaller the lattice constant (e.g., the closer the atoms are together when the crystal is formed). The quantum well region 104 is grown on the waveguide 103 as well as the n-cladding layer 102. When the lattice constant of the n-cladding layer 102 is very different from the lattice constant of the layers that are grown on top of the cladding layer 102 (e.g., the waveguide 103, the quantum well region 104, etc), a strain is imposed (e.g., compress or stretch) on the top layers because the layers attempt to conform with at least the adjacent layers. Accordingly, large differences in the lattice constants results in the creation of more defects in the laser diode 10.

Figure 6A:
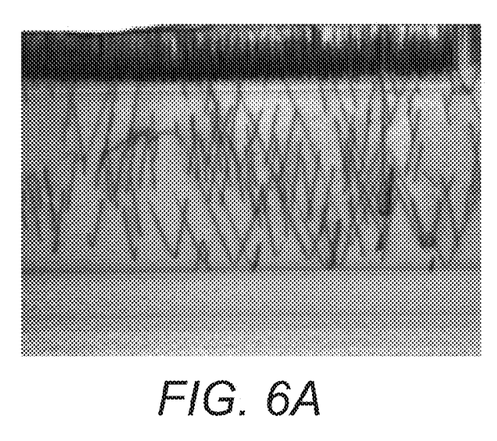
FIGS. 6A and 6B illustrate Transmission Electron Micrograph (TEM) of the cross-section of the device structures utilizing 59% AlGaN on an AlN substrate (FIG. 6A) and 62% AlGaN on an AlN substrate (FIG. 6B).
Figure 6B:
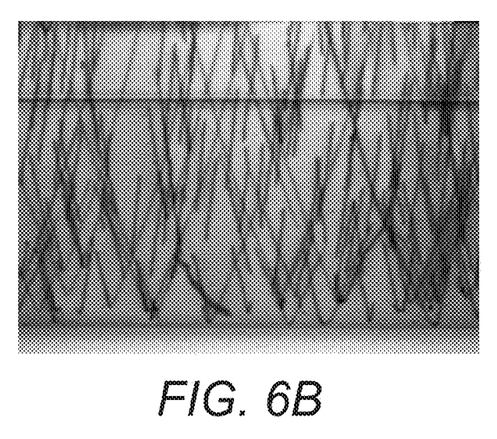

For UV laser diodes, it is desirable to choose a high aluminum alloy composition for the n-cladding layer 102 in order to achieve excellent lattice matching to the substrate 101 which may be an AlN base layer. FIGS. 6A and 6B illustrate examples of laser diodes that include an alloy composition for the n-cladding layer that is not sufficiently high. As shown in FIGS. 6A and 6B, the Transmission Electron Micrograph (TEM) of the cross-section of the device structures utilizing 59% AlGaN on an AlN substrate (FIG. 6A) and 62% AlGaN on an AlN substrate (FIG. 6B) show high levels of defects originating from stacking faults. The photo-pumped lasers that utilizing these n-cladding designs (e.g., utilizing 59% and 62% AlGaN on an AlN substrate, respectively) have high lasing thresholds which are indicative of the poor material quality at the active region. In contrast, the exemplary laser diode that includes AlGaN n-cladding layer 102 having an aluminum percentage of 74%, for example, achieves better lattice matching with the substrate 101. In other words, with this composition, it is possible to grow such material on AlN substrate 101 and retain high crystal quality. The n-cladding layer 102 may be of a thickness of about 1 µm. However, choosing a high aluminum composition for the n-cladding layer requires that the aluminum composition on the p-cladding layer 106 also be chosen to the high. Otherwise, there will be a large difference in refractive index between the n- and p-cladding layers 102, 106 and the optical mode will be pushed asymmetrically towards the p-cladding layer 106 and the contact layer 107. As discussed above, this situation will lead to an unacceptably high internal loss and to a low confinement factor.

Figure 3:
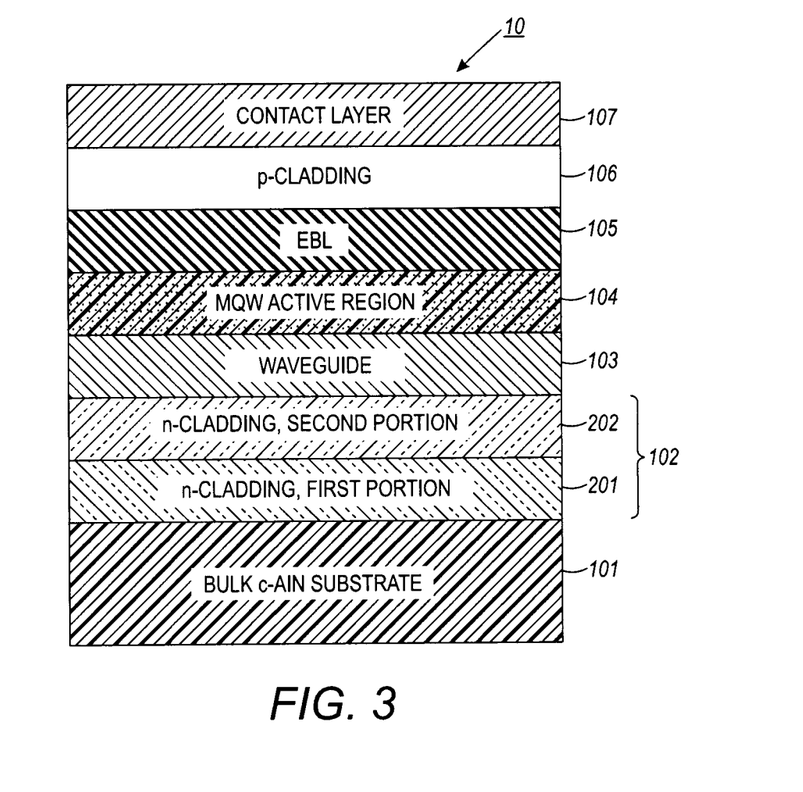
FIG. 3 illustrates cross-sectional view of a laser diode according to an embodiment of the invention.

FIG. 3 illustrates cross-sectional view of a laser diode according to according to an embodiment of the invention. The laser diode in FIG. 3 may be a laser diode in the UV range (e.g., 290 nm in wavelength). This UV bandgap is very large such that very high aluminum content in the alloy (e.g., AlGaN) is needed to create this very large bandgap.

In the laser diode 10 in FIG. 3, the details of the n-cladding layer 102 are illustrated to be a two-section n-cladding layer 102 (e.g., multiple-composition AlGaN sections). As shown in FIG. 3, the n-cladding layer 102 includes a first portion 201 that is grown on the substrate 101 and a second portion 202 that is grown above the first portion 201. The first portion 201 is configured to maintain the high material (crystal) quality at the active region (e.g., quantum well region 104) of the laser diode 10 while the second portion 202 is configured to pull the mode from the p-cladding layer 106 side of the diode 10 to maintain low device modal loss without degrading the crystal quality of the active region (e.g., quantum well region 104). Other engineered non-uniform n-cladding alloy composition profiles that have a component for controlling crystal lattice matching to the substrate and a component for attracting the optical mode toward the active region are also possible.

In other embodiments, more than two sections may be included in the n-cladding layer 102. In other embodiments, the transition between the first portion 201 and the second portion 202 may be graded rather than abrupt. In other embodiments, the n-cladding alloy composition can be monotonically graded with uniform or non-uniform profile gradients.

In order to perform these functions, the first portion 201 includes a higher aluminum content than the second portion 202. In one embodiment, the first portion 201 includes AlGaN with a 66% aluminum content while the second portion 202 includes AlGaN with a 57% aluminum. Further, in order to perform these functions, the first portion 201 may be thicker than the second portion 202. In one embodiment, the first portion 201 is 800 nm in thickness while the second portion 202 is 170 nm in thickness.

Figure 8:
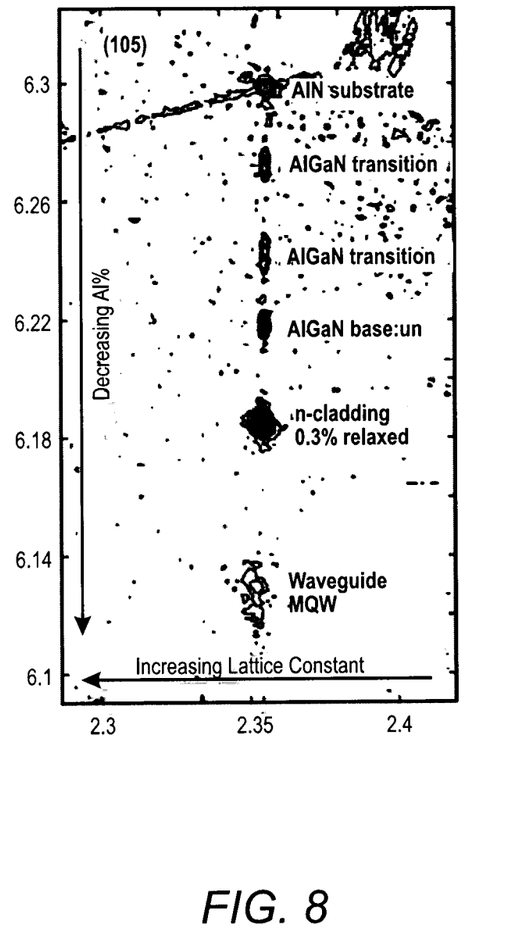
FIG. 8 illustrates an x-ray reciprocal space map of an exemplary laser diode including a 930 nm-thick 66% n-AlGaN cladding.

As shown in FIG. 8, the x-ray reciprocal space map of the exemplary laser diode including a 930 nm-thick 66% n-AlGaN cladding shows a good vertical alignment of the x-ray peaks corresponding to the various layers in the structure which indicates a relaxation of only about 0.3% relative to the AlN substrate. This positive testing result has led the design of some embodiments of the laser diode to include n-cladding designs around alloy compositions of about 66%.

In one embodiment, the Aluminum content (%) of each layer in the diode in FIG. 3 is as follows:

| Layer in the Diode | Aluminum Content in AlGaN |
| --- | --- |
| p-cladding 106 | 60% AlGaN |
| EBL 105 | 69% AlGaN |
| Waveguide 103 | 54% AlGaN |
| n-cladding 202 | 57% AlGaN |
| n-cladding 201 | 66% AlGaN |

Figure 4:
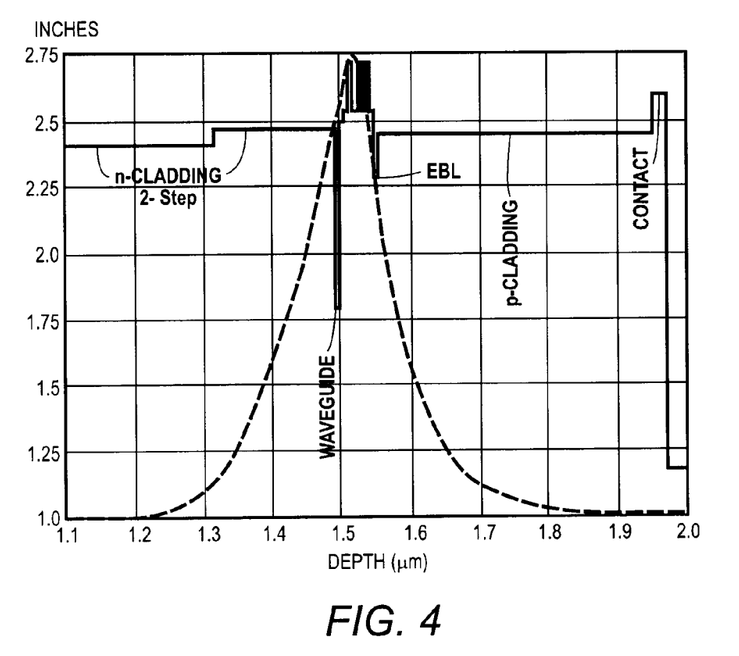
FIG. 4 illustrates a modal profile corresponding to the laser diode in FIG. 3 according to an embodiment of the invention.

Referring to FIG. 4, a modal profile corresponding to the laser diode 10 in FIG. 3 according to an embodiment of the invention is illustrated. In contrast to the modal profile in FIG. 2, FIG. 4 shows an improved confinement of the light in the active region (e.g., the quantum well region 104) and there is less material loss given that the modal profile is pushed towards the n-cladding layer 102 side of the diode 10.

Referring back to FIG. 3, in some embodiments, the laser diode 10 including the n-cladding layer 102 that includes a first portion 201 having a higher aluminum content (e.g., 66% AlGaN) and a second portion 202 having a lower aluminum content (e.g., 57% AlGaN) has a characterized laser threshold of 330 kW/cm$^2$. The laser threshold is an excitation power density at which the laser starts lasing and thus, this low laser threshold of 330 kW/cm$^2$ indicates good material quality.

Figure 9:
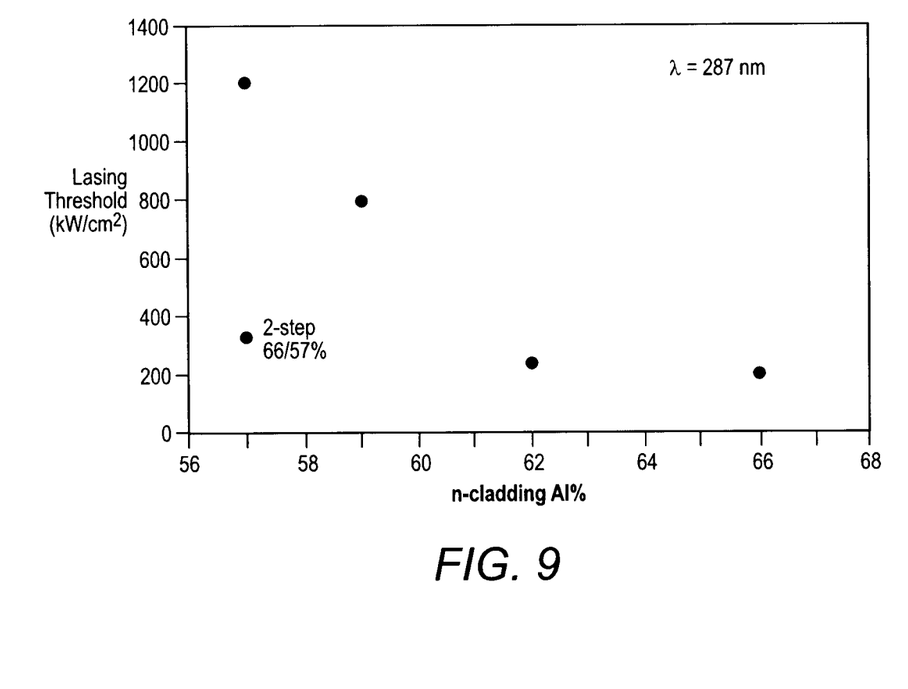
FIG. 9 is a graph that illustrates the characterized laser thresholds as a function of n-cladding aluminum composition.

FIG. 9 is a graph that illustrates the characterized laser thresholds as a function of n-cladding aluminum composition. The n-cladding designs that produce poor material quality would lead to lasers that operate with high threshold pump powers. Conversely, n-cladding designs that produce good material quality would produce lasers with low thresholds. As shown in FIG. 9, the lasing threshold improves from 1.2 MW/cm$^2$ to 200 kW/cm$^2$ as the n-cladding aluminum content is increased from 57% to 66%. FIG. 9 also shows the lasing threshold value of a laser utilizing the two-section n-cladding design according to the embodiment of the invention illustrated in FIG. 3. As shown in FIG. 9, the laser diode according to the embodiment in FIG. 3 has a lasing threshold of 330 kW/cm$^2$ compared to 1.2 MW/cm$^2$ for a thick single step 57% AlGaN n-cladding. The lasers may have waveguide thicknesses of 11 nm and waveguide aluminum compositions of 54% as illustrated in FIG. 4. The quantum well region 104 is grown directly above the waveguide layer 103 such that the properties of the waveguide layer 103 directly affect the crystal quality of the quantum well region 104. As discussed above, the waveguide layer 103 is designed to have a lower aluminum composition than the n-cladding layer 104 in order for the waveguide layer 103 to confine and direct the light towards the end of the laser diode 10. In this embodiment, the second portion 202 of the n-cladding layer 102 includes 57% AlGaN and the waveguide layer 103 includes 54% AlGaN. By minimizing the difference in aluminum content between the waveguide layer 103 and the second portion 202 of the n-cladding layer 102 that is adjacent to the waveguide layer 103, the lattice mismatch between the waveguide layer 103 and the second portion 202 is minimized while providing for a sufficient difference in refractive index between the waveguide layer 103 and the second portion 202 to allow the waveguide layer 103 to function.

Figure 10A:
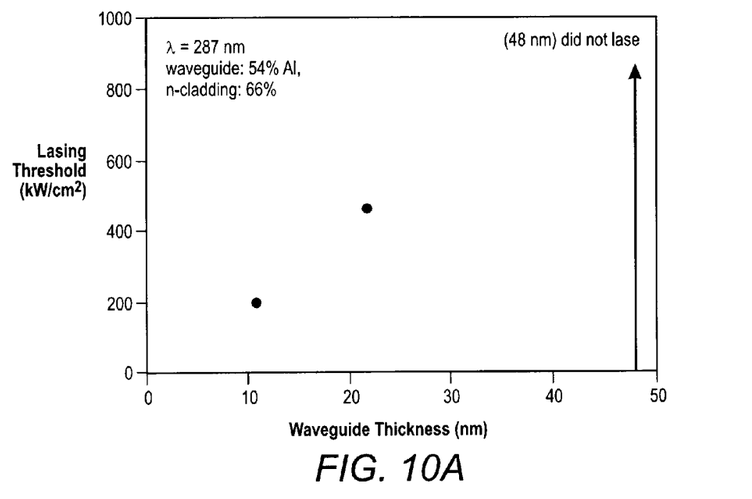
FIG. 10A-10B is a graph illustrating the lasing threshold as a function of the waveguide layer thickness (FIG. 10A) and a graph illustrating the lasing thresholds as a function of the waveguide layer aluminum composition (FIG. 10B).
Figure 10B:
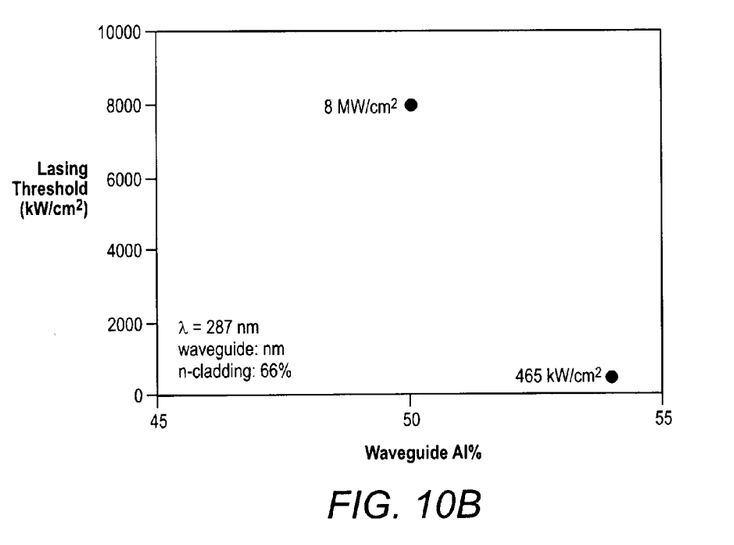

The waveguide layer 103 thickness also affects the degree of strain relaxation at the quantum well region 104. FIG. 10A is a graph illustrating the lasing threshold as a function of the waveguide layer thickness. As shown in FIG. 10A, using lasers that include a waveguide aluminum composition of 54%, the threshold pump powers as shown to increase rapidly with thicker waveguide layers. The laser diode does not lase if the waveguide layer 103 is too thick. For instance, the structures with waveguide layer thicknesses above 48 nm do not lase as illustrated in FIG. 10A. Accordingly, the thickness of the waveguide layer 103 significantly affects material quality of the laser diode 10. In one embodiment, the waveguide 103 may be 11 nm in thickness. In another embodiment, the waveguide layer 103 may be 17 nm in thickness. Similarly, the lasing threshold of the laser diode also becomes too high if the aluminum content of the alloy in the waveguide layer 103 is too low. In FIG. 10B, a graph illustrating the lasing thresholds as a function of the waveguide layer aluminum composition is shown. In FIG. 10B, the lasers have a waveguide thickness of 22 nm. It is shown in FIG. 10B that the lower aluminum compositions have higher lattice mismatch with the AlN substrate. This lattice mismatch causes the material quality to degrade and the lasing threshold to increase. For instance, the laser with 54% aluminum content in the AlGaN waveguide layer operates with a threshold of 465 kW/cm$^2$ but decreasing the waveguide layer composition slightly by 4% to 50% aluminum content causes the threshold to increase by over 17-fold, to 8 MW/cm$^2$.

Figure 11:
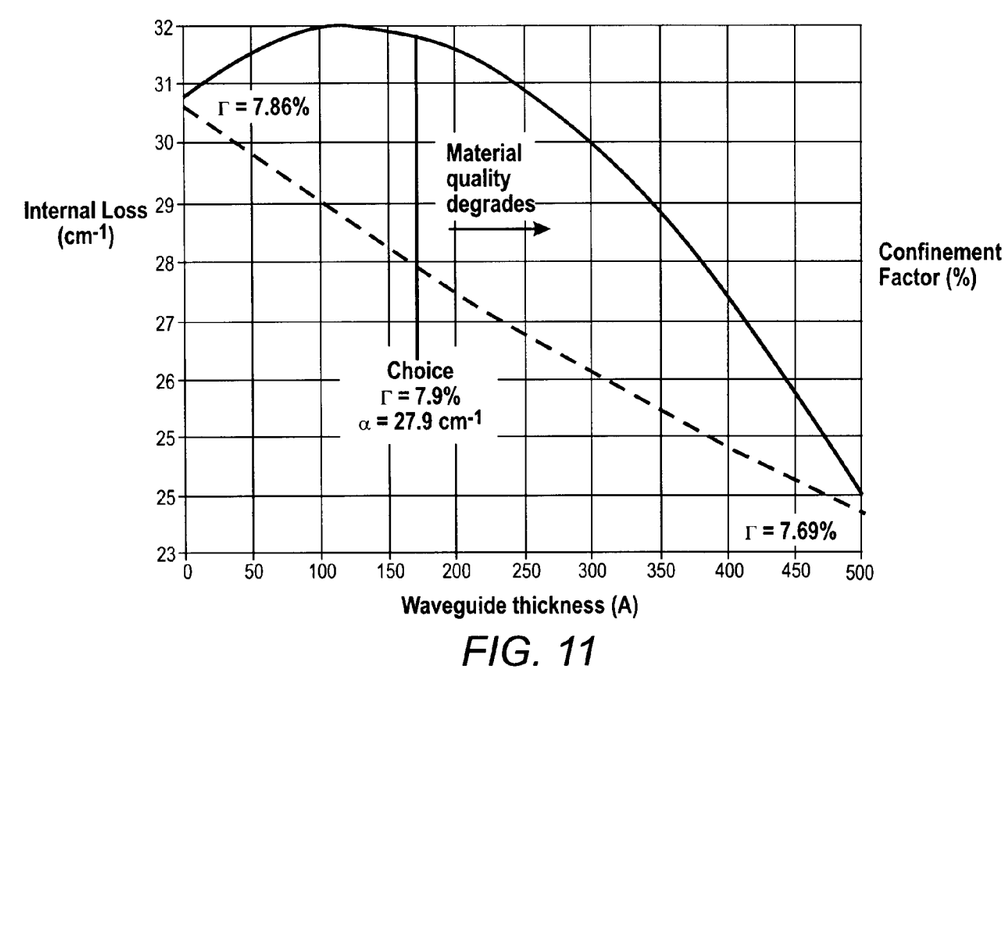
FIG. 11 is a graph illustrating the calculated internal loss and confinement factor as a function of waveguide thickness for the laser diode structure in FIG. 3 according to one embodiment of the invention.

FIG. 11 is a graph illustrating the calculated internal loss (dotted line) and confinement factor (full line) as a function of waveguide thickness for the laser diode structure in FIG. 3 according to one embodiment of the invention. In FIG. 11, the material loss is set at 100 cm$^{-1}$ (k=0.00023) for the p-cladding side of the structure. In one embodiment, the waveguide layer 103 is 17 nm in thickness and includes an aluminum molar fraction of 54% (e.g., 54% AlGaN) and produces a confinement factor of 7.9% and an internal loss of 27.9 cm$^{-1}$. This choice of waveguide 103 thickness is near the value for peak confinement factor. Thicker waveguide layer thicknesses would reduce the internal loss but degrade material quality.

Referring to FIG. 3, the contact layer 107 (or p-contact layer) that is deposited on the p-cladding layer 106 may include Gallium Nitride (GaN). In one embodiment of the AlGaN heterostructures designed for UV lasers, the contact layer 107 has a higher refractive index than the material in the p-cladding layer 106. Thus, the contact layer 107 attracts the mode away from the quantum well region 104 towards the lossy p-cladding layer 106 and the contact layer 107. To counteract the high refractive index of the contact layer 107, the p-cladding layer 106 is designed to be sufficiently thick. For instance, in one embodiment, the p-cladding layer 106 is 400 nm in thickness.

Figure 7:
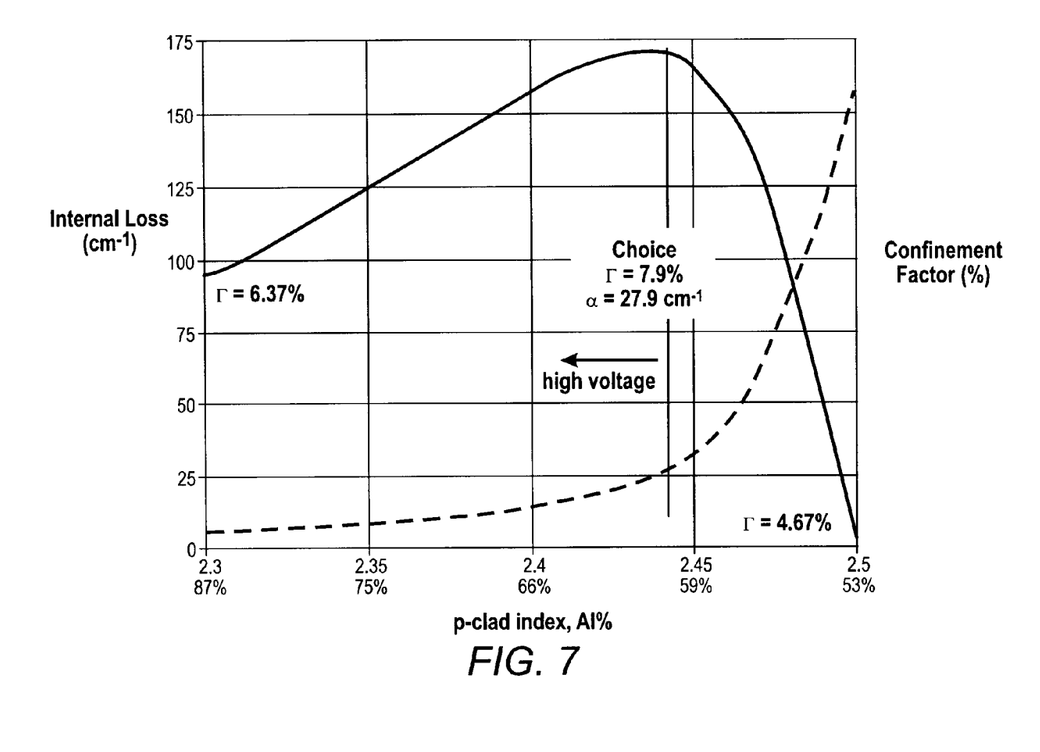
FIG. 7 is a graph that illustrates the calculated internal loss and confinement factor as a function of p-cladding aluminum composition for the laser diode structure in FIG. 3 according to an embodiment of the invention.

Further, the aluminum composition of the p-cladding layer 106 may affect the internal loss and the confinement factor of the laser diode 10. FIG. 7 is a graph that illustrates the calculated internal loss (dotted line) and confinement factor (full line) as a function of p-cladding aluminum composition for the laser diode structure in FIG. 3 according to an embodiment of the invention. A high aluminum composition at the p-cladding layer 106 lowers internal loss by pushing the mode towards the n-cladding layer 102 where material losses are low and the magnesium (Mg)-related losses at the p-cladding layer 106 are also reduced as the bandgap is increased. However, it is noted that device voltages increase rapidly with higher aluminum content in the p-cladding layer 106. Accordingly, in one embodiment as illustrated in FIG. 7, the p-cladding layer 106 includes AlGaN with 60% aluminum content, which corresponds to an internal loss of 27.9 cm$^{-1}$ and a confinement factor 7.9%. This aluminum composition is near the value for peak confinement factor.

The following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 5:
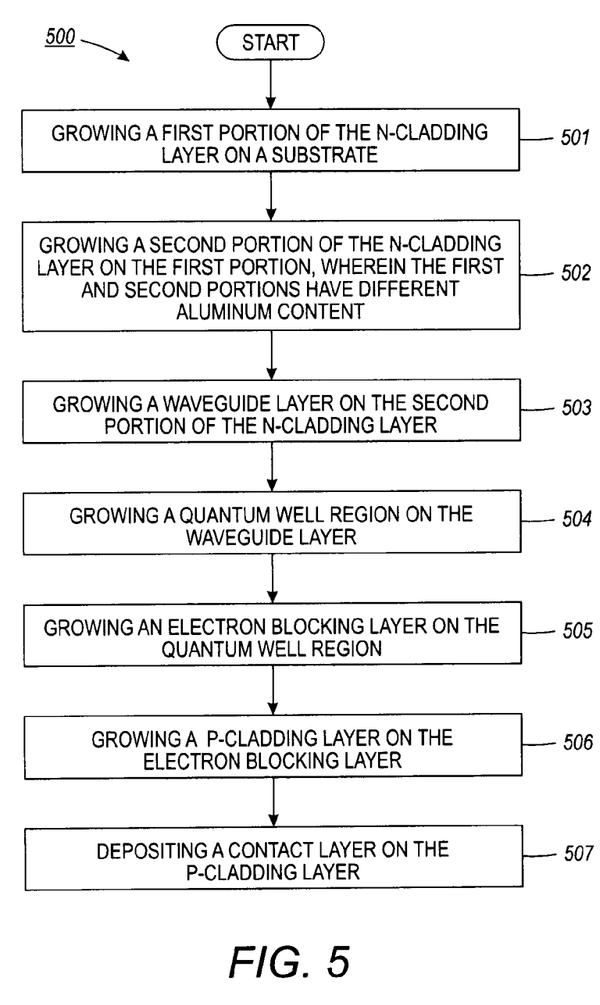
FIG. 5 illustrates a flow diagram of an example method of fabrication of a laser diode in FIG. 3 according to an embodiment of the invention.

FIG. 5 illustrates a flow diagram of an example method of fabrication of a laser diode 10 in FIG. 3 according to an embodiment of the invention. Method 500 starts by growing a first portion 201 of the n-cladding layer 102 on the substrate 101 (Block 501) and growing a second portion 202 of the n-cladding layer 102 on the first portion 201 (Block 502). Both the first and the second portions 201, 202 include a metal alloy such as AlGaN, but the first and second portions 201, 202 have different aluminum content in the metal alloy. In one embodiment, the second portion 202 includes AlGaN with a lower aluminum content than the aluminum content in the AlGaN of the first portion 201. At Block 503, a waveguide layer 103 is grown on the second portion 202 of the n-cladding layer 102. The waveguide layer 103 may include the metal alloy (e.g., AlGaN) with a lower aluminum content than the aluminum content in the metal alloy of the second portion 201 of the n-cladding layer 102. At Block 504, the quantum well region (or active region) 104 may be grown on the waveguide layer 103. In some embodiments, the quantum well region 104 may include multiple quantum wells. At Block 505, the electron blocking layer (EBL) 105 is grown on the quantum well region 104. At Block 506, the p-cladding layer 106 is grown on the EBL 105 and at Block 507, the contact layer 107 is deposited on the p-cladding layer 106.

It is noted that the embodiments described herein may also be implemented in the design of other types of asymmetric waveguide devices that simultaneously need high crystal quality, good modal confinement at the active region, low p-side electrical resistance, and low optical loss.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. There are numerous other variations to different aspects of the invention described above, which in the interest of conciseness have not been provided in detail. Accordingly, other embodiments are within the scope of the claims.

The invention claimed is:

1. A laser diode comprising:
a p-cladding layer;
an n-cladding layer, the n-cladding layer comprising an engineered non-uniform alloy composition including a bottom portion and an upper portion,
wherein the bottom portion maintains material quality, wherein the bottom portion is substantially lattice matched to the substrate, and
the upper portion pulls a mode from the p-cladding layer, wherein the bottom portion and the upper portion are compressively strained layers;
a waveguide coupled to the upper portion of the n-cladding layer; and
a light-emitting region coupled to the waveguide, wherein the light-emitting region is located between the n-cladding layer and the p-cladding layer.

2. The laser diode of claim 1, wherein the bottom portion is thicker than the upper portion.

3. The laser diode of claim 1, wherein the bottom portion and the upper portion being an alloy material, the bottom portion having a higher aluminum content than the upper portion.

4. The laser diode of claim 3, wherein the waveguide being the alloy material, the waveguide having a lower aluminum content than the upper portion.

5. The laser diode of claim 4, further comprising: an electron blocking layer (EBL) located between the p-cladding layer and the light-emitting region.

6. The laser diode of claim 3, wherein the alloy material is aluminum gallium nitride (AlGaN).

7. The laser diode of claim 6, wherein the bottom portion being AlGaN with greater than 60% aluminum content, and the upper portion being AlGaN with less than 60% aluminum content.

8. The laser diode of claim 7, wherein the p-cladding being AlGaN with less than 70% aluminum content.

9. The laser diode of claim 8, wherein the waveguide being AlGaN with less than 60% aluminum content.

10. A laser diode comprising:
a p-cladding layer;
an n-cladding layer including at least a first portion and a second portion,
wherein the first portion maintains material quality of the laser diode, wherein the first portion is substantially lattice matched to a substrate, and
the second portion pulls a mode from the p-cladding layer, wherein the first portion and the second portion are compressively strained layers;
a waveguide coupled to the n-cladding layer; and
a light-emitting region coupled to the waveguide, wherein the light-emitting region is located between the n-cladding layer and the p-cladding layer.

11. The laser diode of claim 10, wherein the first portion is thicker than the second portion.

12. The laser diode of claim 10, wherein the first portion and the second portion being an alloy material, the first portion having a higher aluminum content than the second portion.

13. The laser diode of claim 12, wherein the waveguide being the alloy material, the waveguide having a lower aluminum content than the second portion.

14. The laser diode of claim 13, further comprising: an electron blocking layer (EBL) located between the p-cladding layer and the light-emitting region.

15. The laser diode of claim 12, wherein the alloy material is aluminum gallium nitride (AlGaN).

16. The laser diode of claim 15, wherein the first portion being AlGaN with greater than 60% aluminum content, and the second portion being AlGaN with less than 60% aluminum content.

17. The laser diode of claim 16, wherein the p-cladding being AlGaN with less than 70% aluminum content.

18. The laser diode of claim 17, wherein the waveguide being AlGaN with less than 60% aluminum content.

19. A laser diode comprising:
an n-cladding layer that includes an alloy material, the n-cladding layer including a first portion and a second portion, wherein the first portion is thicker than the second portion, wherein the first portion includes higher aluminum content than the second portion, wherein the first portion is substantially lattice matched to a substrate, wherein the first portion and the second portion are compressively strained layers;
a p-cladding layer that includes the alloy material;
a waveguide coupled to the n-cladding layer; and
a light-emitting region coupled to the waveguide, wherein the light-emitting region is located between the n-cladding layer and the p-cladding layer.

20. The laser diode in claim 19, further comprising:
the substrate coupled to the first portion of the n-cladding layer;
wherein the second portion of the n-cladding layer is coupled to the waveguide.

21. The laser diode of claim 20, wherein
the n-cladding layer is an alloy material,
an amount of aluminum content of the second portion is based on a thickness of the waveguide and an amount of aluminum content of the waveguide.

22. The laser diode in claim 19, wherein the light-emitting region is a multiple quantum well active region.

23. A laser diode comprising:
a light-emitting region
an electron blocking layer (EBL) above the light-emitting region
an upper waveguide layer above the light-emitting region;
a p-cladding layer above the upper waveguide layer
a lower waveguide layer below the light-emitting region;
an n-cladding layer below the lower waveguide layer including a first portion and a second portion, wherein the first portion is thicker than the second portion,
wherein the first portion maintains material quality of the laser diode, wherein the first portion is substantially lattice matched to a substrate; and
the second portion pulls an electric field profile from the p-cladding layer, wherein pulling the electric field profile from the p-cladding layer includes pulling a light intensity from the p-cladding toward the light-emitting region, wherein the first portion and the second portion are compressively strained layers.

24. The laser diode of claim 22, wherein the n-cladding layer is an alloy material and the first portion having higher aluminum content than the second portion.

25. The laser diode in claim 24, wherein the alloy material is AlGaN.

* * * * *